(12) United States Patent
Horning

(10) Patent No.: US 10,939,576 B2
(45) Date of Patent: Mar. 2, 2021

(54) POWER CONNECTOR ASSEMBLY FOR A COMMUNICATION SYSTEM

(71) Applicant: TE CONNECTIVITY CORPORATION, Berwyn, PA (US)

(72) Inventor: Michael James Horning, Landisville, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/668,695

(22) Filed: Oct. 30, 2019

(65) Prior Publication Data

US 2020/0170139 A1    May 28, 2020

Related U.S. Application Data

(60) Provisional application No. 62/772,126, filed on Nov. 28, 2018.

(51) Int. Cl.
| | | |
|---|---|---|
| H01R 25/14 | (2006.01) | |
| H05K 7/14 | (2006.01) | |
| H05K 7/18 | (2006.01) | |

(52) U.S. Cl.
CPC ............ *H05K 7/1492* (2013.01); *H01R 25/14* (2013.01); *H05K 7/1457* (2013.01); *H05K 7/1489* (2013.01); *H05K 7/1491* (2013.01); *H05K 7/186* (2013.01)

(58) Field of Classification Search
CPC .... H01R 25/14; H01R 25/142; H01R 25/162; B60M 1/34; B60M 1/30; H05K 7/1492; H05K 7/1457; H05K 7/1489; H05K 1/144; H05K 3/325; H05K 7/1465; H05K 7/1491; H05K 7/186
See application file for complete search history.

(56) References Cited

U.S. PATENT DOCUMENTS

| | | | |
|---|---|---|---|
| 3,639,885 A | 2/1972 | Yoshiya et al. | |
| 3,772,482 A | 11/1973 | Ross, Jr. | |
| 4,137,424 A * | 1/1979 | Hesse | H01R 25/14 |
| | | | 174/97 |

(Continued)

FOREIGN PATENT DOCUMENTS

| | | |
|---|---|---|
| CN | 102037616 B | 5/2014 |
| CN | 102232260 B | 9/2017 |

(Continued)

OTHER PUBLICATIONS

Search Report for corresponding CN Application No. 2016110758683 (1 page).

(Continued)

*Primary Examiner* — Adam B Dravininkas

(57) ABSTRACT

A power connector includes a housing holding first and second power contacts. The housing has first and second rails defining a slot receiving a power rail. The housing has an upper contact channel in an upper wall and a lower contact channel in a lower wall receiving the power contacts. The power contacts each have a base and deflectable spring beams extending into the slot and being exposed at the slot for slidable electrical connection to a first power rail contact of the power rail on an upper surface the power rail and a second power rail contact of the power rail on a lower surface the power rail.

20 Claims, 7 Drawing Sheets

(56) References Cited

U.S. PATENT DOCUMENTS

| | | | | |
|---|---|---|---|---|
| 4,245,873 | A | 1/1981 | Markowitz | |
| 4,564,165 | A * | 1/1986 | Grant | E04B 9/006 248/317 |
| 4,729,742 | A * | 3/1988 | Onishi | H01R 25/14 439/208 |
| 4,781,627 | A | 11/1988 | Farag et al. | |
| 4,845,589 | A | 7/1989 | Weidler et al. | |
| 5,418,328 | A | 5/1995 | Nadeau | |
| 5,431,576 | A | 7/1995 | Matthews | |
| 5,619,187 | A | 4/1997 | Bodahl-Johnsen | |
| 5,664,953 | A | 9/1997 | Reylek | |
| 5,759,051 | A | 6/1998 | Cancellieri et al. | |
| D405,417 | S | 2/1999 | Matthews | |
| 5,895,275 | A | 4/1999 | Harbertson | |
| 5,993,222 | A | 11/1999 | Nicolette et al. | |
| 6,004,138 | A | 12/1999 | Harbertson | |
| 6,059,582 | A | 5/2000 | Tsai | |
| 6,089,929 | A | 7/2000 | Sloey | |
| 6,203,088 | B1 | 3/2001 | Fernandez et al. | |
| 6,205,029 | B1 | 3/2001 | Byrne et al. | |
| 6,205,929 | B1 | 3/2001 | Byrne et al. | |
| 6,239,975 | B1 | 5/2001 | Otis | |
| 6,325,645 | B1 | 12/2001 | Schuite | |
| 6,424,525 | B1 | 7/2002 | MacLeod et al. | |
| 6,439,900 | B1 | 8/2002 | Sward | |
| 6,445,571 | B1 | 9/2002 | Inniss et al. | |
| 6,498,716 | B1 | 12/2002 | Salinas et al. | |
| 6,655,977 | B2 | 12/2003 | Ives et al. | |
| 6,746,284 | B1 * | 6/2004 | Spink, Jr. | H01R 13/115 439/651 |
| 6,790,059 | B2 | 9/2004 | Pochlau | |
| 6,827,592 | B2 | 12/2004 | McCoy et al. | |
| 6,842,348 | B2 | 1/2005 | Lee | |
| 6,911,251 | B2 | 6/2005 | Duclos | |
| 6,921,278 | B2 | 7/2005 | Ives et al. | |
| 6,969,938 | B2 | 11/2005 | Seguchi | |
| 7,086,904 | B1 | 8/2006 | Kuan et al. | |
| 7,094,077 | B1 | 8/2006 | Chen | |
| 7,142,411 | B2 | 11/2006 | McLeod | |
| 7,186,118 | B2 | 3/2007 | Hansen et al. | |
| 7,329,146 | B2 | 2/2008 | Yang | |
| 7,403,396 | B2 * | 7/2008 | Belady | H05K 7/1498 361/727 |
| 7,438,566 | B2 | 10/2008 | Chen | |
| 7,520,763 | B1 | 4/2009 | Buse | |
| 7,581,972 | B2 | 9/2009 | Daamen | |
| 7,654,844 | B1 | 2/2010 | Wormsbecher et al. | |
| 7,661,966 | B2 | 2/2010 | Ohanesian | |
| 7,669,271 | B2 | 3/2010 | Gonzalez Alemany et al. | |
| 7,722,367 | B2 | 5/2010 | Jung | |
| 7,744,386 | B1 | 6/2010 | Speidel et al. | |
| 7,764,498 | B2 | 7/2010 | Conn | |
| 7,784,888 | B2 | 8/2010 | Oh et al. | |
| 7,819,676 | B1 | 10/2010 | Cardoso et al. | |
| 7,833,027 | B2 | 11/2010 | Jong | |
| 7,940,504 | B2 | 5/2011 | Spitaels et al. | |
| 7,993,150 | B1 * | 8/2011 | Crow | H01R 25/14 439/215 |
| 8,109,652 | B2 | 2/2012 | Chen | |
| 8,118,606 | B2 | 2/2012 | Larsson | |
| 8,212,427 | B2 | 7/2012 | Spitaels et al. | |
| 8,419,450 | B2 | 4/2013 | Schmiedle et al. | |
| 8,469,726 | B2 | 6/2013 | Ferales Fayos | |
| 8,491,343 | B2 | 7/2013 | Wang et al. | |
| 8,616,921 | B2 | 12/2013 | Byrne et al. | |
| 8,711,569 | B2 | 4/2014 | Yi | |
| 8,814,383 | B2 | 8/2014 | Bizzotto et al. | |
| 8,897,017 | B2 | 11/2014 | Brahsers et al. | |
| 8,899,780 | B2 | 12/2014 | Masik et al. | |
| 8,911,251 | B2 | 12/2014 | Ehlen | |
| 8,911,521 | B1 | 12/2014 | Ehlen | |
| 9,128,682 | B2 | 9/2015 | Dean et al. | |
| 9,229,496 | B2 | 1/2016 | Cravens et al. | |
| 9,379,503 | B2 | 6/2016 | Bonzi et al. | |
| 9,379,504 | B2 | 6/2016 | Chinn | |
| 9,380,702 | B2 | 6/2016 | Fricker | |
| 9,450,358 | B2 | 9/2016 | Ehlen | |
| 9,491,885 | B2 | 11/2016 | Noland et al. | |
| 9,559,474 | B2 | 1/2017 | Chen | |
| 9,582,818 | B2 | 2/2017 | Florschuetz et al. | |
| 9,608,392 | B1 | 3/2017 | Destro | |
| 9,619,422 | B2 | 4/2017 | Muhsam | |
| 9,625,134 | B2 | 4/2017 | Chien | |
| 9,693,477 | B1 | 6/2017 | Ehlen | |
| 9,706,677 | B2 | 7/2017 | Cravens et al. | |
| 9,706,678 | B1 | 7/2017 | Chen et al. | |
| 9,865,980 | B2 | 1/2018 | Li et al. | |
| 9,867,309 | B2 | 1/2018 | Su et al. | |
| 9,985,403 | B1 | 5/2018 | Herring et al. | |
| 10,015,903 | B1 | 7/2018 | Ehlen | |
| 2008/0106892 | A1 | 5/2008 | Griffiths et al. | |
| 2008/0144293 | A1 | 6/2008 | Aksamit et al. | |
| 2009/0034181 | A1 | 2/2009 | Gizycki | |
| 2010/0103687 | A1 | 4/2010 | Pitlor | |
| 2010/0330817 | A1 | 12/2010 | van Ekstrom | |
| 2011/0203637 | A1 * | 8/2011 | Patton | H02S 20/23 136/244 |
| 2012/0039032 | A1 | 2/2012 | Archibald et al. | |
| 2012/0094512 | A1 * | 4/2012 | Northey | G09B 19/00 439/116 |
| 2013/0052840 | A1 | 2/2013 | Wang et al. | |
| 2013/0335907 | A1 | 12/2013 | Shaw et al. | |
| 2014/0112001 | A1 * | 4/2014 | Noh | F21V 23/005 362/311.01 |
| 2014/0159968 | A1 | 6/2014 | Maier et al. | |
| 2015/0043151 | A1 | 2/2015 | Cravens et al. | |
| 2016/0150681 | A1 | 5/2016 | Leigh et al. | |
| 2016/0262282 | A1 | 9/2016 | Li et al. | |
| 2016/0316939 | A1 * | 11/2016 | Kraiss | A47F 5/103 |
| 2017/0033521 | A1 | 2/2017 | Wessel | |
| 2017/0033522 | A1 | 2/2017 | Nicieja et al. | |
| 2018/0031217 | A1 * | 2/2018 | Tuchler | F21V 21/35 |
| 2018/0128468 | A1 * | 5/2018 | Chien | F21V 23/06 |
| 2018/0151995 | A1 * | 5/2018 | Herring | H01R 12/7088 |
| 2018/0212390 | A1 * | 7/2018 | Herring | H01R 12/7088 |
| 2019/0379170 | A1 * | 12/2019 | Mulfinger | H05K 7/1457 |

FOREIGN PATENT DOCUMENTS

| | | | |
|---|---|---|---|
| EP | 0723711 | B1 | 9/1997 |
| FR | 2623030 | A1 | 5/1989 |
| GB | 1 281 062 | A | 7/1972 |
| WO | 2009117679 | A2 | 9/2009 |
| WO | 2011133732 | A2 | 10/2011 |
| WO | 2012113807 | A1 | 8/2012 |
| WO | 2014160556 | A2 | 10/2014 |

OTHER PUBLICATIONS

Connector Socket, 15 position, side entry, C-86516825, Nov. 29, 2006, 2 pages, Rev. Am. Harrisburg, PA.

SARTI, Open Compute Project "Open Rack Hardware vo.6" 15 pages.

SARTI, Open Compute Project "Open Rack Hardware v1.0" 16 pages.

SARTI, Open Compute Project "4200W @12V (N+1) Redundant Power Shelf Hardware wo.3 OR-draco-cinnabari-o.3" 19 pages.

Mills "Open Rack Mechanical Specification V1.8" 8 pages.

Adrian, Open Compute Project "Cubby Three-Bay Shelf for Open Rack V2 " 20 pages.

* cited by examiner

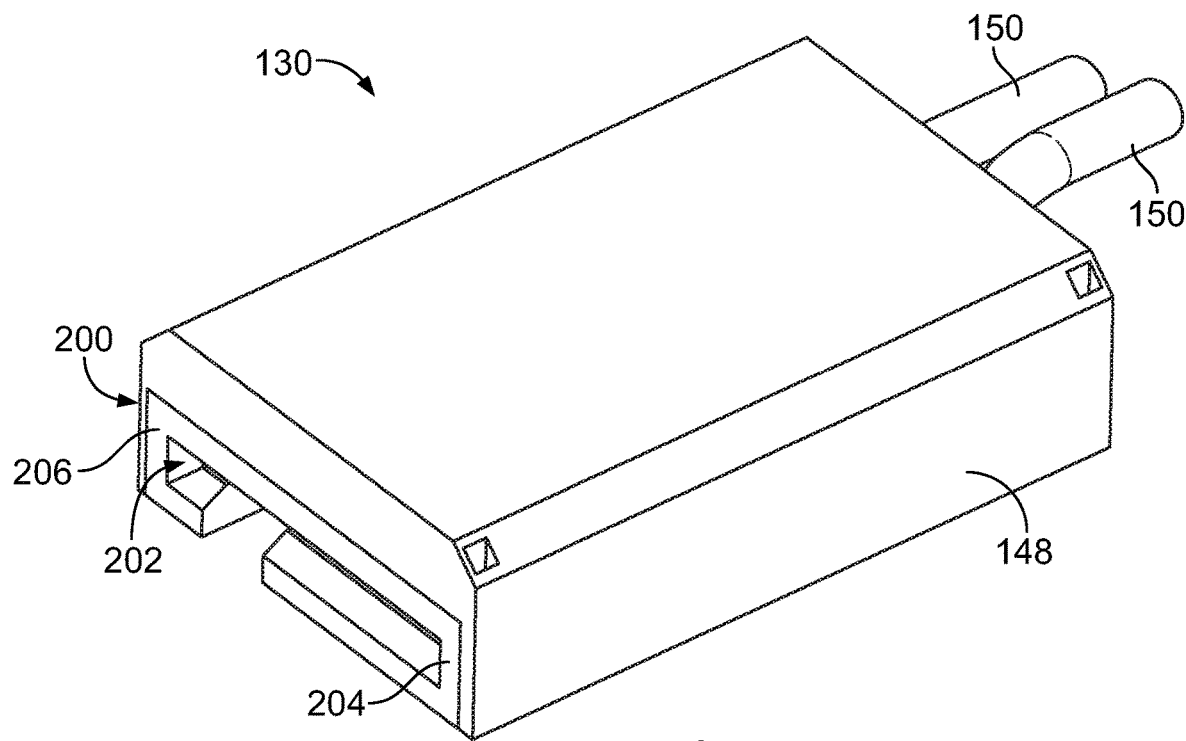
FIG. 5
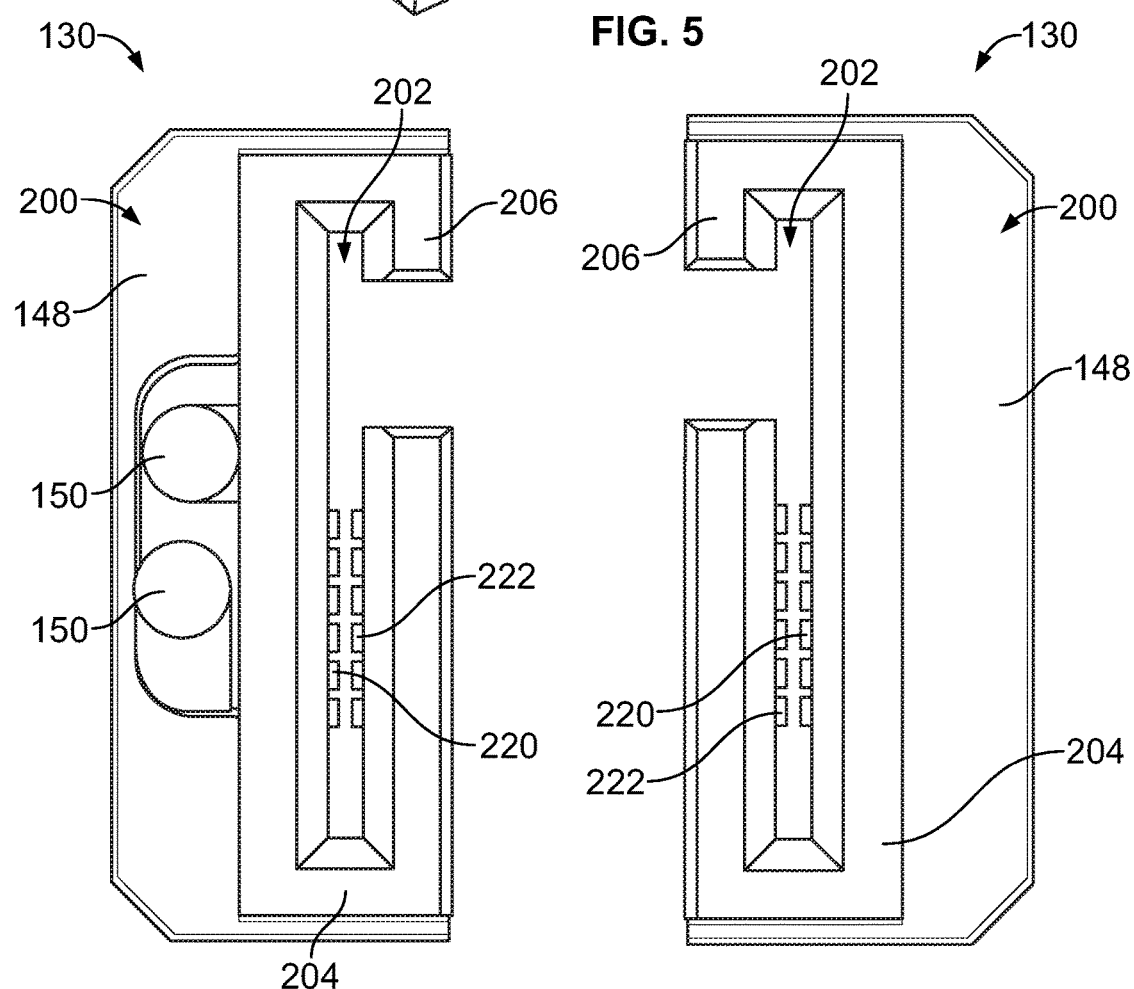
FIG. 6  FIG. 7

POWER CONNECTOR ASSEMBLY FOR A COMMUNICATION SYSTEM

CROSS REFERENCE TO RELATED APPLICATIONS

This application claims benefit to U.S. Provisional Application No. 62/772,126, filed Nov. 28, 2018, titled "POWER CONNECTOR ASSEMBLY FOR A COMMUNICATION SYSTEM", the subject matter of which is herein incorporated by reference in its entirety.

BACKGROUND OF THE INVENTION

The subject matter herein relates generally to power connector assemblies for communication systems.

Some communication systems include an equipment cabinet holding communication equipment in an equipment rack. The equipment racks are typically slidable or extendable, such as in a drawer, between closed and open positions. For example, the equipment rack may be slid open to access components of the communication system, such as electrical components mounted on a circuit board within the drawer, for service, testing and the like. Typically, the electrical components are powered through a power supply of the communication system. However, in some applications it may be desirable to maintain the equipment in a powered and operating state during service. Conventional communication systems that maintain power to the electrical components during service use power wires connected to the circuit board that are extendible with the equipment rack. The power wires need to be long enough to accommodate the full extension of the equipment rack so that as the equipment rack travels the power wires may extend or contract within a defined space without being damaged or causing damage to other components.

Conventional communication systems having power wires are not without disadvantages. For instance, the long length of power wires occupy valuable space within the equipment rack which could otherwise be used for increasing ventilation through the equipment cabinet or additional electrical components if the power wires were removed. Furthermore, as power requirements to the communication system increase, the size and/or quantity of power wires needed to support the current increases, thereby leading to larger and stiffer wire bundles. Some known communication systems provide power to the electrical components using a sliding power connector slidable on a power rail. However, the power rail provides the positive and negative conductors on the same side of the power rail causing a risk of short circuiting. Additionally, the positive and negative conductors present a risk of danger from shock if touched by an operator.

BRIEF DESCRIPTION OF THE INVENTION

In one embodiment, a power connector is provided including a housing, a first power contact held by the housing, and a second power contact held by the housing. The housing extends along a housing axis between a front and a rear opposite the front. The housing has a top and a bottom opposite the top extending between the front and the rear. The housing has a first side and a second side opposite the first side extending between the front and the rear. The housing has a first rail at the first side and a second rail at the second side. The first and second rails define a slot configured to receive a power rail along the housing axis. The slot is open at the front and the rear. The housing has an upper wall above the slot and a lower wall below the slot. The housing has an upper contact channel in the upper wall and a lower contact channel in the lower wall. The first power contact is held above the slot. The first power contact has a first base received in the upper contact channel and deflectable first spring beams extending from the first base into the slot and being exposed at the slot for slidable electrical connection to a first power rail contact of the power rail on an upper surface the power rail. The second power contact is held below the slot. The second power contact has a second base received in the lower contact channel and deflectable second spring beams extending from the second base into the slot and being exposed at the slot for slidable electrical connection to a second power rail contact of the power rail on a lower surface the power rail.

In another embodiment, a power connector assembly is provided including a power connector having a housing holding a first power contact and a second power contact. The housing is configured to be coupled to and movable with a movable unit. The housing extends along a housing axis between a front and a rear opposite the front. The housing has a top and a bottom opposite the top extending between the front and the rear and the housing has a first side and a second side opposite the first side extending between the front and the rear. The housing has a first rail at the first side and a second rail at the second side. The first and second rails define a slot configured to receive a power rail along the housing axis. The housing is configured to slide along the power rail with the movable unit. The slot is open at the front and the rear. The housing has an upper wall above the slot and a lower wall below the slot. The housing has an upper contact channel in the upper wall and a lower contact channel in the lower wall. The first power contact has a first base received in the upper contact channel and deflectable first spring beams extending from the first base into the slot and being exposed at the slot for slidable electrical connection to a first power rail contact of the power rail on an upper surface the power rail. The second power contact has a second base received in the lower contact channel and deflectable second spring beams extending from the second base into the slot and being exposed at the slot for slidable electrical connection to a second power rail contact of the power rail on a lower surface the power rail. The power connector assembly includes a first power cable electrically coupled to the first power contact and extending from the housing to the movable unit. The power connector assembly includes a second power cable electrically coupled to the second power contact and extending from the housing to the movable unit. The first and second power cables provide power to the movable unit from the first and second power contacts and the power rail.

In a further embodiment, a power connector assembly is provided including a power rail that is elongated from a first end of the power rail to a second end of the power rail. The power rail has an upper surface and a lower surface. The power rail has a first power rail contact on the upper surface and a second power rail contact on the lower surface. The power connector assembly includes a power connector having a housing holding a first power contact and a second power contact. The housing is configured to be coupled to and movable with a movable unit. The housing extends along a housing axis between a front and a rear opposite the front. The housing has a top and a bottom opposite the top extending between the front and the rear and the housing has a first side and a second side opposite the first side extending between the front and the rear. The housing has a first rail at the first side and a second rail at the second side. The first and second rails define a slot configured to receive a power rail along the housing axis. The housing is configured to slide along the power rail with the movable unit. The slot is open at the front and the rear. The housing has an upper wall above the slot and a lower wall below the slot. The housing has an upper contact channel in the upper wall and a lower contact channel in the lower wall. The first power contact has a first base received in the upper contact channel and deflectable first spring beams extending from the first base into the slot and being exposed at the slot for slidable electrical connection to a first power rail contact of the power rail on an upper surface the power rail. The second power contact has a second base received in the lower contact channel and deflectable second spring beams extending from the second base into the slot and being exposed at the slot for slidable electrical connection to a second power rail contact of the power rail on a lower surface the power rail.

BRIEF DESCRIPTION OF THE DRAWINGS

FIG. 5 is a front perspective view of a power connector of the power connector assembly in accordance with an exemplary embodiment.

FIG. 6 is a rear view of the power connector in accordance with an embodiment.

FIG. 7 is a front view of the power connector in accordance with an embodiment.

DETAILED DESCRIPTION OF THE INVENTION

Figure 1:
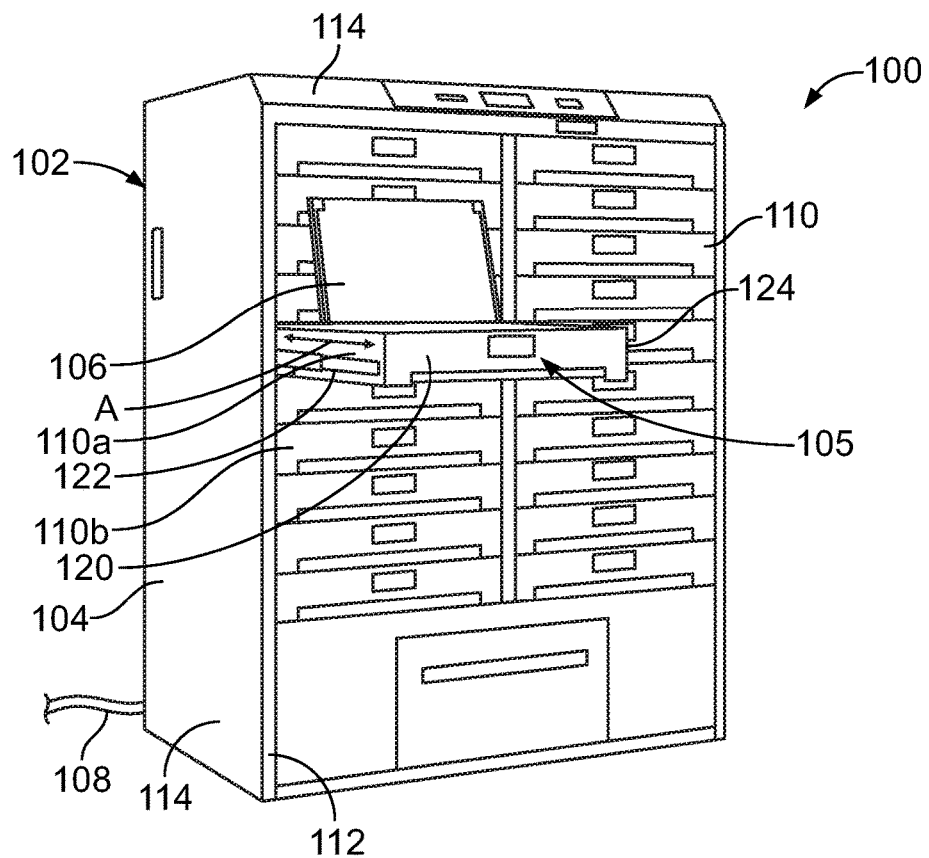
FIG. 1 illustrates a communication system in accordance with an embodiment.

FIG. 1 illustrates a communication system 100 in accordance with an embodiment. The communication system 100 may be a network component, a server or another type of communication system 100. The communication system 100 includes an equipment cabinet 102 having a chassis 104 and movable units 105 held by the chassis 104. In the illustrated embodiment, the movable units 105 are equipment racks 110. The equipment racks 110 include drawers 120 and communication equipment 106 held within the drawers 120. The equipment cabinet 102 has a power supply 108 configured to supply power to the communication equipment 106. The power supply may include a power cable, a power bus bar, or other power supply elements.

The equipment racks 110 are slidable between closed and open positions relative to the chassis 104. For example, FIG. 1 illustrates one of the equipment racks 110a in an open position and other equipment racks 110b in a closed position. The equipment racks 110 in the closed positions are enclosed within the chassis 104 such that the communication equipment 106 within the racks 110 is not accessible to an operator from outside of the equipment cabinet 102. The equipment racks 110 are opened by pulling or otherwise extending the racks 110 away from the chassis 104 to access the communication equipment 106 for use, repair and/or replacement. In an embodiment, the communication equipment 106 is powered by the power supply 108 when the equipment rack 110 is in the closed position and in the open position. For example, when the equipment rack 110 is open, the communication system 100 maintains the communication equipment 106 in a powered and operating state, such as during use and/or during service.

The chassis 104 may have any size or shape depending on the particular application. The chassis 104 may hold any number of equipment racks 110. In the illustrated embodiment, the equipment racks 110 are stacked in two columns; however, the equipment racks 110 may have other configurations in alternative embodiments, such as stacked in a single column. In the illustrated embodiment, the equipment racks 110 are oriented horizontally; however, the equipment racks 110 may have other orientations, such as a vertical orientation, in alternative embodiments.

The chassis 104 has frame supports 112 that define a frame to support the equipment racks 110 and/or the communication equipment 106. The chassis 104 may also include panels 114 extending between the frame supports 112. The panels 114 may be side panels that define an exterior of the equipment cabinet 102 and/or may be divider panels that extend between adjacent equipment racks 110. In other embodiments, the chassis 104 may be open, only including the frame supports 112 without the panels 114.

In an embodiment, each equipment rack 110 includes a respective drawer 120 that holds and supports the communication equipment 106 of the equipment rack 110. The drawer 120 includes multiple walls 124 to enclose the communication equipment 106, such as along the bottom, sides, front, back, top and/or the like. The drawer 120 may also have slides 122 used to extend the drawer 120 to the open position. The drawer 120 is extendable in a sliding direction along an extension axis, shown by arrow A. The communication equipment 106 is moveable with the drawer 120 between the closed and open positions. When the drawer 120 is in the open position, the drawer 120 projects out of a front of the chassis 104 and the communication equipment 106 is accessible for use and/or for service. Other types of equipment racks 110 may be used in alternative embodiments.

In an embodiment, the communication system 100 includes power connector assemblies 130 (shown in FIG. 2) for powering the communication equipment 106 from the power supply 108. The power connector assemblies 130 are arranged such that the communication equipment 106 may be powered during the entire extension cycle of the extendable equipment rack 110 between the closed position and the open position.

Figure 2:
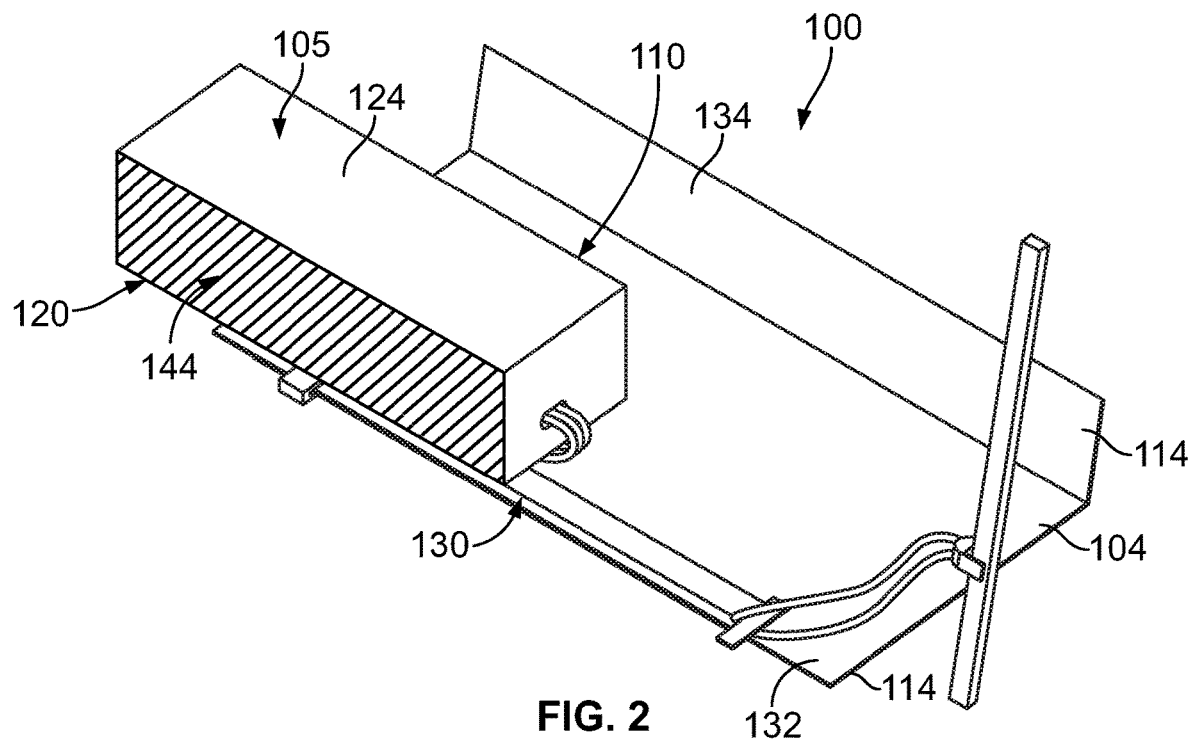
FIG. 2 is a rear perspective view of a portion of the communication system in accordance with an embodiment.

FIG. 2 is a rear perspective view of a portion of the communication system 100 showing one of the movable units 105, such as an equipment rack 110, mounted to a portion of the chassis 104. FIG. 2 also illustrates a power connector assembly 130 used to power the communication equipment 106 (shown in FIG. 1) as the equipment rack 110 is opened and closed during an extension cycle of the equipment rack 110. The portion of the chassis 104 shown in FIG. 2 has multiple panels 114, including a bottom panel 132 and a side panel 134. The side panel 134 is oriented perpendicular to the bottom panel 132. As used herein, relative or spatial terms such as "front," "rear," "top," "bottom," "inner," and "outer" are only used to identify and distinguish the referenced elements in the orientations shown in the illustrated figures and do not necessarily require particular positions or orientations relative to gravity and/or the surrounding environment of the communication system 100.

In an embodiment, a portion of the power connector assembly 130 is mounted to the side panel 134. The bottom panel 132 may separate the equipment rack 110 from another equipment rack 110 located below the equipment rack 110. The bottom panel 132 may be a piece of sheet metal. The bottom panel 132 is optional such that the chassis 104 in another embodiment may be provided without the bottom panel 132. In another alternative embodiment, a portion of the power connector assembly 130 is mounted to the bottom panel 132 instead of to the side panel 134.

The drawer 120 in the illustrated embodiment has multiple walls 124. The walls 124 define a cavity 144 in which the communication equipment 106 may be stored. A portion of the power connector assembly 130 may be coupled to and movable with the drawer 120. For example, a portion of the power connector assembly 130 may be mounted to the bottom; however, the power connector assembly 130 may be coupled to other walls in alternative embodiments.

The power connector assembly 130 is used to power the communication equipment 106 (FIG. 1) held within the drawer 120, regardless of the position or movement of the equipment rack 110 between the open position and the closed position. The drawer 120 and the portion of the power connector assembly 130 that is mounted to the drawer 120 are movable relative to the chassis 104 and the portion of the power connector assembly 130 that is mounted to the chassis 104.

Figure 3:
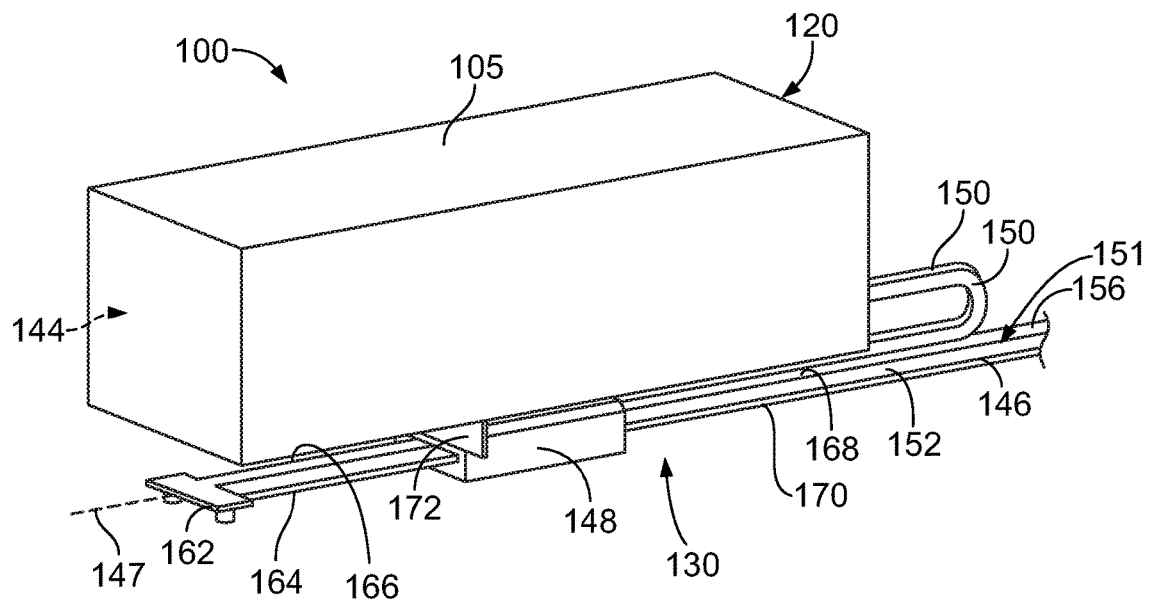
FIG. 3 is a front perspective view of a portion of the communication system showing a movable unit and a power connector assembly in accordance with an embodiment.
Figure 4:
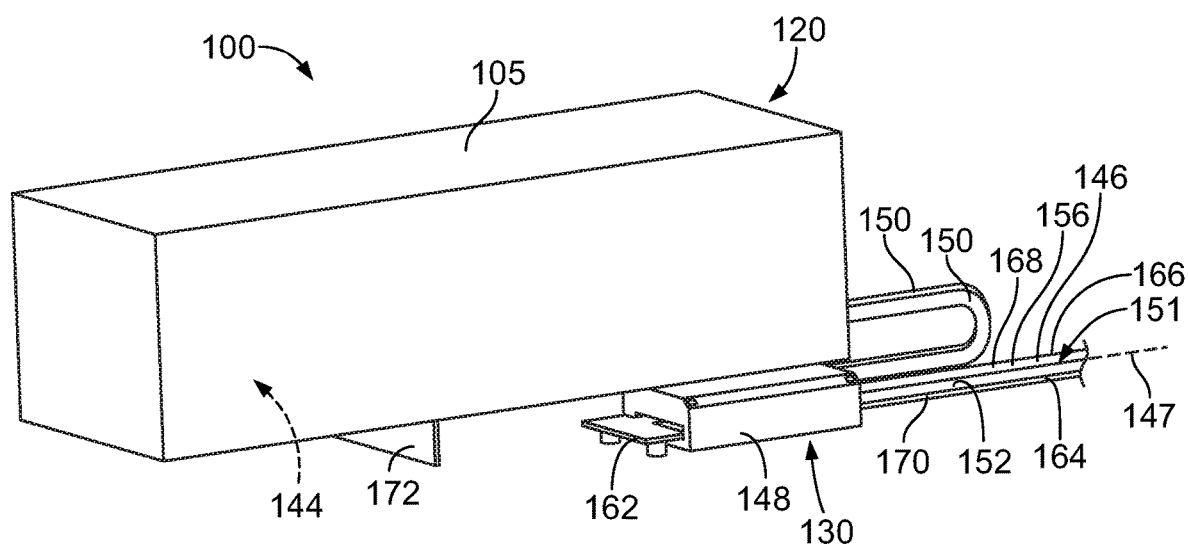
FIG. 4 is another front perspective view of a portion of the communication system showing the movable unit and the associated power connector assembly in accordance with an embodiment.

FIG. 3 is a front perspective view of a portion of the communication system 100 showing one of the movable units 105 and the associated power connector assembly 130. FIG. 4 is another front perspective view of a portion of the communication system 100 showing one of the movable units 105 and the associated power connector assembly 130. FIG. 3 illustrates the movable unit 105 in a first extended position. FIG. 4 illustrates the movable unit 105 in a second extended position further extended from the first extended position.

The power connector assembly 130 includes a power rail 146, a power connector 148, and power cables 150 electrically coupled between the power connector 148 and the movable unit 105. The power cables 150 may extend into the cavity 144 of the movable unit 105 for powering the communication equipment 106 (shown in FIG. 1). The power connector 148 is electrically connected to the power rail 146. In an exemplary embodiment, the power rail 146 is fixedly mounted to the chassis 104 (shown in FIG. 1), or other fixed component associated with the chassis 104, and the movable unit 105 is movable relative to the power rail 146. For example, the movable unit 105 may be moved through an extension cycle between a closed position and an open position in an opening direction and a closing direction relative to the chassis 104. The power connector 148 is configured to be coupled to the movable unit 105 and is movable with the movable unit 105 to slide along the power rail 146. In an exemplary embodiment, the power connector 148 is capable of being decoupled from the movable unit 105 to allow the movable unit 105 to move relative to the power connector 148. For example, when the power connector 148 reaches the end of the power rail 146, the movable unit 105 separates from the power connector 148 as the movable unit 105 continues to move in the opening direction. The power cables 150 allow relative movement between the movable unit 105 and the power connector 148 to accommodate the additional opening of the movable unit 105. As the movable unit 105 is moved along the extension cycle between the closed position and the open position, the power connector 148 is moved relative to the power rail 146 while maintaining mechanical and electrical engagement with one another.

The power rail 146 has an elongated length that extends along a rail axis 147. The power connector 148 moves (e.g., slides) along the power rail 146 parallel to the rail axis 147. The power rail 146 includes a power supply circuit 151 for supplying power to the power connector 148. The power supply circuit 151 includes a first power rail contact 152 and a second power rail contact 154 (shown in FIG. 12) configured to be electrically connected to the power connector 148. In the illustrated embodiment, the power rail 146 includes a power rail circuit board 156 with conductive traces that define the first and second power rail contacts 152, 154 of the power supply circuit 151. In another embodiment, the power rail 146 may be a bus bar that includes insulative dielectric material that extends between the first and second power rail contacts 152, 154. The dielectric material may coat the bus bar along the surface area of the bus bar other than the power supply circuit 151 to protect from electrical shocks.

In an exemplary embodiment, the first power rail contact 154 is provided on an upper surface 168 of the power rail 146. The first power rail contact 152 may be an elongated contact strip or circuit trace that conveys electric current along the power rail 146 to the power connector 148. The first power rail contact 152 may provide a ground or return path. In an exemplary embodiment, the second power rail contact 154 is provided on a lower surface 170 of the power rail 146. The second power rail contact 154 may be an elongated contact strip or circuit trace that conveys electric current along the power rail 146 to the power connector 148. The second power rail contact 154 may provide a ground or return path. In an exemplary embodiment, the first power rail contact 152 is a positive electrode or anode and may be referred to hereinafter as a positive electrode 152 or an anode 152. In an exemplary embodiment, the second power rail contact 154 is a negative electrode or cathode and may be referred to hereinafter as a negative electrode 154 or a cathode 154.

In one or more embodiments, the communication system 100 is arranged to be touch-safe, such that the anode 152 of the power rail 146 which is "hot" or "live" and has the potential to produce electrical shocks, is generally protected from the fingers and tools of an operator throughout the extension cycle of the movable unit 105. For example, having the first and second power rail contacts 152, 154 on opposite sides of the power rail 146 physically separates the power rail contacts 152, 154 to reduce the risk of short circuiting the power supply circuit 151. Having the first and second power rail contacts 152, 154 on opposite sides of the power rail 146 makes the power rail 146 touch safe by reducing the risk of electrical shock from inadvertent touching of the power rail 146.

The power rail 146 extends along the rail axis 147 between opposite ends 162. The power rail 146 includes a first edge 164 and a second edge 166 opposite the first edge 164. The first and second edges 164, 166 extend between the ends 162. In the illustrated embodiment, the anode 152 is provided on the upper surface 168, and the cathode 154 is provided on the opposite, lower surface 170. The cathode 154 extends a majority of the length between the ends 162. The anode 152 and the cathode 154 are exposed along the surfaces 168, 170 to engage and electrically connect to the power connector 148.

The power connector 148 is mounted to the movable unit 105, such as at the bottom of the movable unit 105. Optionally, the movable unit 105 may include a mounting bracket 172, such as at the bottom. The power connector 148 is coupled to the mounting bracket 172. In an exemplary embodiment, the power connector 148 is removably coupled to the mounting bracket 172 to allow the movable unit 105 to move relative to the power connector 148 (for example, for extended opening of the drawer 120). For example, the power connector 148 may be magnetically coupled to the mounting bracket 172 in various embodiments. The power connector 148 may be coupled by other separable connection means, such as using a latchable connection, a ball-detent connection, and the like. The power cables 150 are terminated (e.g., mechanically and electrically connected) to the power connector 148 and extend into the cavity 144. The power cables 150 may be electrically connect to one or more power supply devices within the cavity 144 to power the communication equipment 106 (FIG. 1). The power cables 150 have a length that that is sufficient to reach from the power connector 148 to the power supply device in the cavity and have excess slack to be extendible to allow the movable unit 105 to move relative to the power connector 148 along the extended travel of the extension cycle. The power cables 150 do not require a length equal to the entire travel length of the movable unit 105 as the power connector 148 is able to slide along the power rail 146 for a length of the travel distance.

FIG. 5 is a front perspective view of the power connector 148 of the power connector assembly 130 in accordance with an exemplary embodiment. FIG. 6 is a rear view of the power connector 148. FIG. 7 is a front view of the power connector 148. The power connector 148 includes a housing 200. The housing 200 receives the power rail 146 (FIG. 3) and slides along the power rail 146 as the movable unit 105 (FIG. 3) is opened and closed.

The housing 200 defines a track or slot 202 that receives the power rail 146. The housing 200 includes a first rail 204 and a second rail 206 that define edges of the slot 202. The first rail 204 engages the first edge 164 (FIG. 3) of the power rail 146. The second rail 206 engages the second edge 166 (FIG. 3) of the power rail 146 that is opposite the first edge 164. The rails 204, 206 may engage the edges 164, 166, respectively, to fix a lateral position of the power connector 148 relative to the power rail 146. The rails 204, 206 guide movement of the power connector 148 along the power rail 146 in bidirectional sliding directions parallel to the rail axis 147.

In an embodiment, the power connector 148 includes a first power contact 220 and a second power contact 222 held in the housing 200. In an exemplary embodiment, the first and second power contacts 220, 222 are arranged on opposite sides of the slot 202. The power contacts 220, 222 are electrically connected to corresponding power cables 150. With the power rail 146 received in the slot 202 of the housing 200, the power contacts 220, 222 mechanically engage and electrically connect to the power supply circuit 151 of the power rail 146. The power contacts 220, 222 engage opposite sides of the power rail 146. The power contacts 220 slide along the power rail 146 as the movable unit 105 is opened and closed during the extension cycle. The power contacts 220 maintain electrical connection with the power rail 146 throughout the entire extension cycle. Optionally, the power contacts 220 may be spring contacts configured to be resiliently deflected against the power rail 146. However, other types of power contacts 220 may be provided in alternative embodiments, such as spring loaded pins, such as pogo pins, wave springs, or other types of contacts, such as conductive polymer elements. In an exemplary embodiment, the first power contact 220 is a positive electrode or anode and may be referred to hereinafter as a positive electrode 220 or an anode 220. In an exemplary embodiment, the second power contact 222 is a negative electrode or cathode and may be referred to hereinafter as a negative electrode 222 or a cathode 222.

Figure 8:
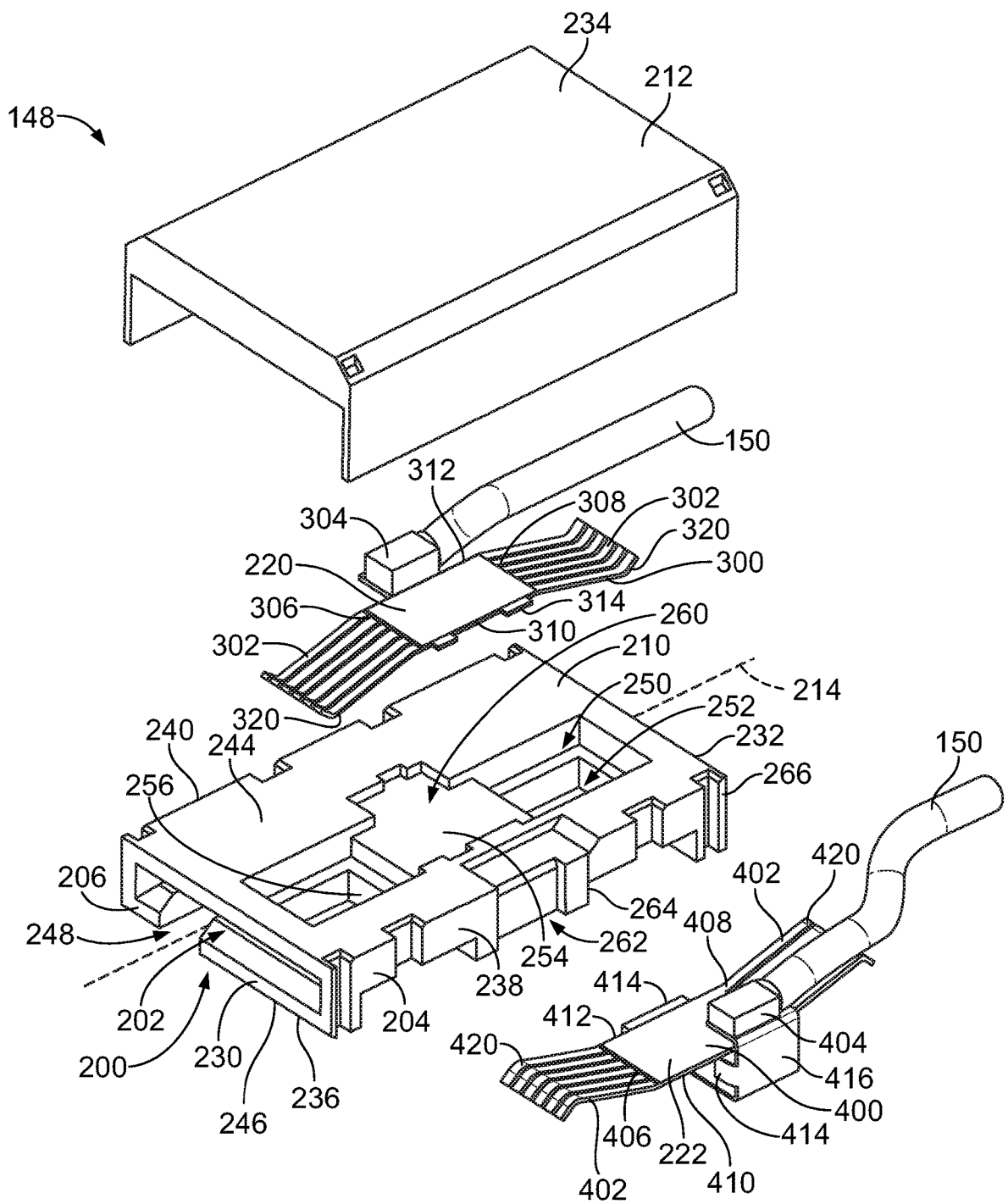
FIG. 8 is an exploded view of the power connector in accordance with an exemplary embodiment.
Figure 9:
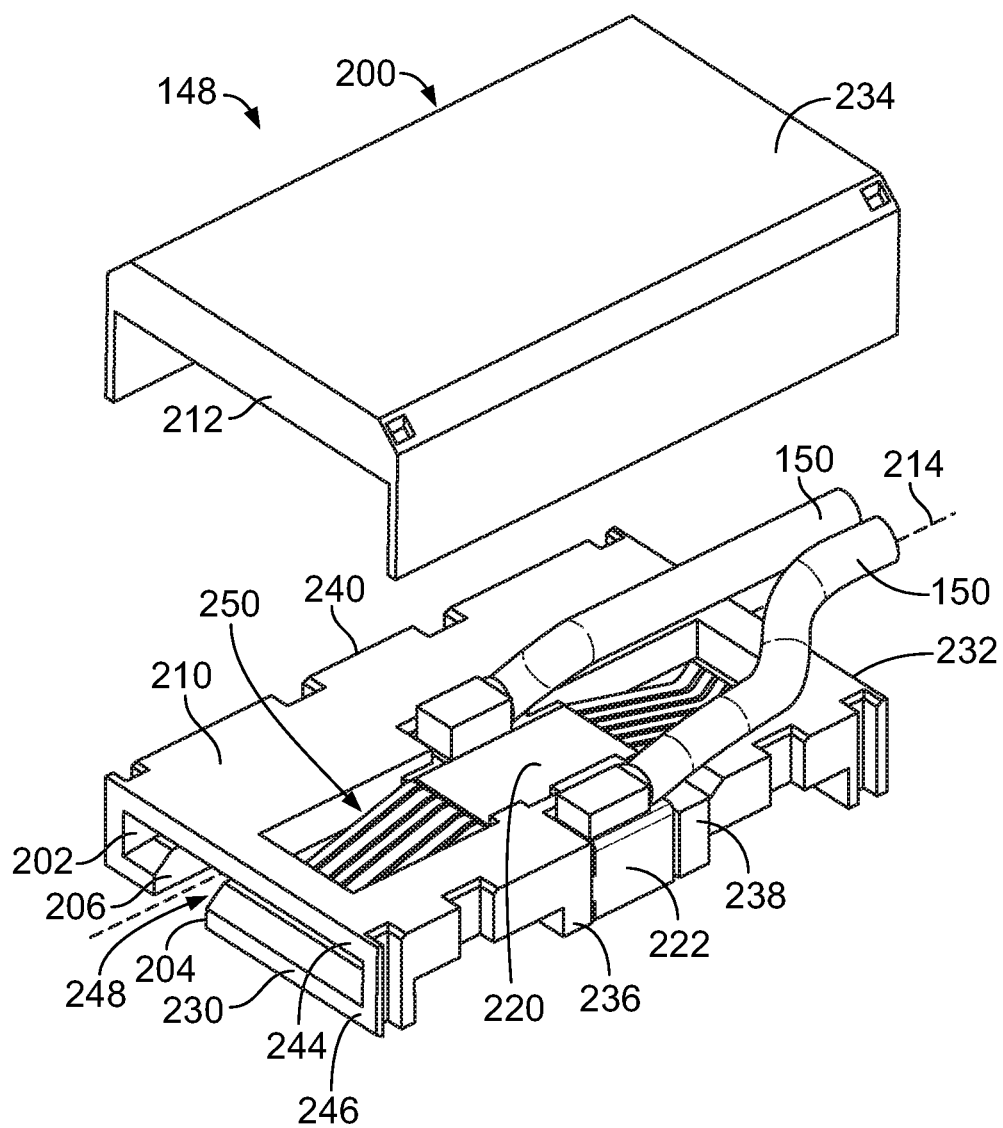
FIG. 9 is a partially assembled view of the power connector in accordance with an exemplary embodiment.

FIG. 8 is an exploded view of the power connector 148 in accordance with an exemplary embodiment. FIG. 9 is a partially assembled view of the power connector 148 in accordance with an exemplary embodiment. The power connector 148 includes the housing 200 holding the first and second power contacts 220, 222. Optionally, the housing 200 may be a multipiece housing, such as including a main body 210 and a cover 212. The cover 212 is configured to be coupled to the main body 210 to cover the first power contact 220 and/or the second power contact 222. In other various embodiments, the housing may include other pieces, such as a lower cover along the bottom.

The slot 202 extends through the housing 200 along a housing axis 214. The housing 200 is configured to be slidable along the power rail 146 (shown in FIG. 2) parallel to the housing axis 214. The housing 200 extends between a front 230 and a rear 232 opposite the front 230. The slot 202 extends between the front 230 and the rear 232. The slot 202 is open at the front 230 and open at the rear 232 such that the power rail 146 extends through the housing 200. The housing 200 has a top 234 and a bottom 236 opposite the top 234 extending between the front 230 and the rear 232. The housing 200 has a first side 238 and a second side 240 opposite the first side 238 extending between the front 230 and the rear 232. The first rail 204 is provided at the first side 238. The second rail 206 is provided at the second side 240. The first rail 204 wraps around (and defines) one edge of the slot 202, and the second rail 206 wraps around (and defines) the opposite edge of the slot 202.

The housing 200 has an upper wall 244 along the top 234 and a lower wall 246 along the bottom 236. The upper wall 244 is located above the slot 202 and defines a portion of the slot 202. The lower wall 246 is located below the slot 202 and defines a portion of the slot 202. The upper wall 244 covers the first power rail contact 152 on the upper surface 168 of the power rail 146 and the lower wall 246 covers the second power rail contact 154 on the lower surface 170 of the power rail 146. As such, the upper wall 244 and the lower wall 246 of the housing 200 is touch-safe by covering the conductors of the power rail 146. The first and second sides 238, 240 between the upper and lower walls 244, 246 define portions of the slot 202. The upper wall 244 defines a portion of the first rail 204 and defines a portion of the second rail 206. The lower wall 246 defines a portion of the first rail 204 and defines a portion of the second rail 206. For example, the first rail 204 extends along the bottom 236, the first side 238, and the top 234, and the second rail 206 extends along the bottom 236, the second side 240, and the top 234.

In an exemplary embodiment, the upper wall 244 is continuous between the first side 238 and the second side 240. The lower wall 246, however, has a gap 248 and is thus noncontinuous between the first side 238 and the second side 240. The gap 248 extends the length of the housing 200 between the front 230 and the rear 232. The gap 248 is shaped and positioned to receive fasteners or other components extending from the power rail 146 to allow the power connector 148 to slide along the power rail 146. The gap 248 is positioned between the first rail 204 and the second rail 206. Optionally, the gap 248 may be offset, such as closer to the second side 240. In various embodiments, the first and second power contacts 220, 222 are offset from the gap 248, such as toward the first side 238 from the gap 248. In various embodiments, the gap 248 is narrow and does not expose the second power rail contact 154 on the lower surface 170 of the power rail 146.

In an exemplary embodiment, the housing 200 includes an upper contact channel 250 in the upper wall 244 and a lower contact channel 252 in the lower wall 246. In an exemplary embodiment, the upper and lower contact channels 250, 252 are both contained in the first rail 204. The upper contact channel 250 receives the first power contact 220 and the lower contact channel 252 receives the second power contact 222. The upper contact channel 250 is open to the slot 202 allowing the first power contact 220 to be exposed within the slot 202. The lower contact channel 252 is open to the slot 202 allowing the second power contact 222 to be exposed within the slot 202. Optionally, the first and second power contacts 220, 222 are aligned with each other on opposite sides of the slot 202, such as proximate to the first side 238. In an exemplary embodiment, the upper wall 244 includes a bridge 254 spanning across the upper contact channel 250. The bridge 254 is used to support the first power contact 220 within the upper contact channel 250. In an exemplary embodiment, the lower wall 246 includes a bridge 256 spanning across the lower contact channel 252. The bridge 256 is used to support the second power contact 222. The slot 202 is located between the upper bridge 254 and the lower bridge 256.

In an exemplary embodiment, the upper wall 244 includes a pocket 260 that receives a portion of the first power contact 220. The pocket 260 is a recess at the top 234 that receives a portion of the first power contact 220. The first power contact 220 may be positioned relative to the housing 200 within the pocket 260. The first power contact 220 may engage surfaces or walls of the pocket 260 to position the first power contact 220 relative to the housing 200. The cover 212 may be used to cover the first power contact 220 and the pocket 260. In an exemplary embodiment, the lower wall 246 includes a pocket 262 that receives a portion of the second power contact 222. The pocket 262 is a recess at the bottom 236 that receives a portion of the second power contact 222. In an exemplary embodiment, the housing 200 includes a pocket 264 at the first side 238 that receives a portion of the second power contact 222. The pocket 262 is a recess at the second side 240. The second power contact 222 may be positioned relative to the housing 200 in the pockets 262, 264. The second power contact 222 may engage surfaces or walls of the pockets 262, 264 to position the second power contact 222 relative to the housing 200. The cover 212 may be used to cover the second power contact 222 and the pocket 264. Optionally, a cover may be used to cover the pocket 262.

The first power contact 220 includes a first base 300 and first spring beams 302 extending from the first base 300. Optionally, the first power contact 220 includes a cable connector 304 extending from the base 300. The power cable 150 is terminated to the cable connector 304. For example, the power cable 150 may be soldered to the cable connector 304. In other various embodiments, the power cable 150 may be crimped to the cable connector 304 or terminated by other means. The power cable 150 extends from the upper wall 244 at the rear 232. The base 300 extends between a front 306 and a rear 308. The base 300 includes a first side 310 and a second side 312 extending between the front 306 and the rear 308. In an exemplary embodiment, the first power contact 220 includes mounting tabs 314 extending from the first side 310 and/or the second side 312 for securing the first power contact 220 to the housing 200. The base 300 is received in the upper contact channel 250, such as in the pocket 260 of the upper wall 244. Optionally, the cable connector 304 may be received in the pocket 260 of the upper wall 244. The first power contact 220 is coupled to the upper wall 244 such that the spring beams 302 extend downward to the slot 202 for mating with the power rail 146.

The spring beams 302 extend from the base 300 to mating interfaces 320. In an exemplary embodiment, the spring beams 302 are deflectable relative to the base 300. For example, the spring beams 302 may be flexed or bent away from initial resting positions when mating with the power rail 146. The spring beams 302 may be angled relative to the base 300 such that the spring beams 302 extend out of a plane defined by the base 300 when in the resting positions. When mating with the power rail 146, the spring beams 302 may flex towards the plane defined by the base 300. In an exemplary embodiment, the spring beams 302 extend from the front 306 and the rear 308 of the base 300. However, in alternative embodiments, the spring beams 302 extend from only the front 306 or only the rear 308. In other various embodiments, the spring beams 302 may extend from other edges of the base 300, such as the first side 310 and/or the second side 312. Optionally, multiple spring beams 302 extend from the corresponding edge. The spring beams 302 are individually deflectable. Each spring beam 302 has a corresponding point of contact with the power rail 146 at the mating interface 320. Optionally, the spring beams 302 have curved mating interfaces 320 for sliding engagement with the power rail 146.

The second power contact 222 includes a second base 400 and second spring beams 402 extending from the second base 400. Optionally, the second power contact 222 includes a support bracket 416 extending from the base 400. The support bracket 416 is configured to be coupled to the housing 200, such as at the first side 238. Optionally, the second power contact 222 includes a cable connector 404, such as extending from the support bracket 416 or the base 400. The power cable 150 is terminated to the cable connector 404. For example, the power cable 150 may be soldered to the cable connector 404. In other various embodiments, the power cable 150 may be crimped to the cable connector 404 or terminated by other means. The power cable 150 extends from the upper wall 244 at the rear 232. The base 400 extends between a front 406 and a rear 408. The base 400 includes a first side 410 and a second side 412 extending between the front 406 and the rear 408. In an exemplary embodiment, the second power contact 222 includes mounting tabs 414 extending from the first side 410 and/or the second side 412 for securing the second power contact 222 to the housing 200. Optionally, the second power contact 222 may include mounting tabs 414 extending from the support bracket 416 configured to engage the first side 238 of the housing 200 to secure the second power contact 222 to the housing 200. The base 400 is received in the lower contact channel 252, such as in the pocket 262 of the lower wall 246. Optionally, the cable connector 404 may be received in a pocket 266 of the upper wall 244. The support bracket 416 is received in the pocket 264. The second power contact 222 is positioned along the lower wall 246 such that the spring beams 402 extend upward to the slot 202 for mating with the power rail 146.

The spring beams 402 extend from the base 400 to mating interfaces 420. In an exemplary embodiment, the spring beams 402 are deflectable relative to the base 400. For example, the spring beams 402 may be flexed or bent away from initial resting positions when mating with the power rail 146. The spring beams 402 may be angled relative to the base 400 such that the spring beams 402 extend out of a plane defined by the base 400 when in the resting positions. When mating with the power rail 146, the spring beams 402 may flex towards the plane defined by the base 400. In an exemplary embodiment, the spring beams 402 extend from the front 406 and the rear 408 of the base 400. However, in alternative embodiments, the spring beams 402 extend from only the front 406 or only the rear 408. In other various embodiments, the spring beams 402 may extend from other edges of the base 400, such as the first side 410 and/or the second side 412. Optionally, multiple spring beams 402 extend from the corresponding edge. The spring beams 402 are individually deflectable. Each spring beam 402 has a corresponding point of contact with the power rail 146 at the mating interface 420. Optionally, the spring beams 402 have curved mating interfaces 420 for sliding engagement with the power rail 146.

Figure 10:
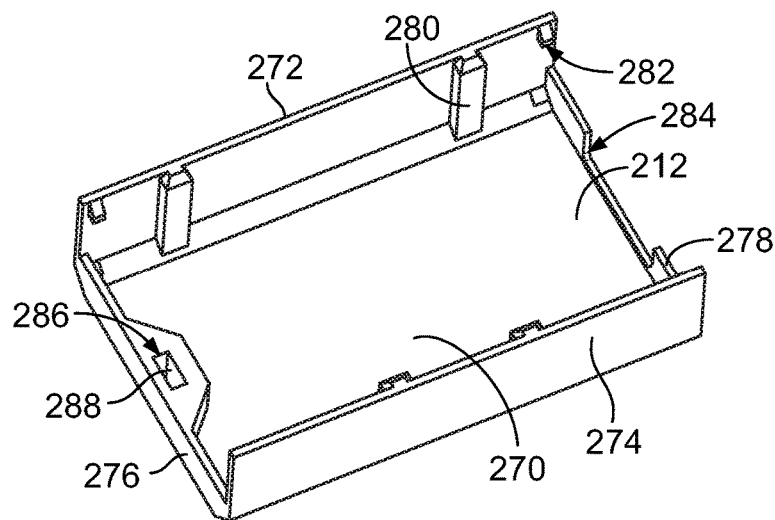
FIG. 10 is a bottom perspective view of a cover of the power connector in accordance with an exemplary embodiment.

FIG. 10 is a bottom perspective view of the cover 212 in accordance with an exemplary embodiment. The cover 212 includes a top wall 270 and sidewalls 272, 274 extending from the top wall 270. The cover 212 includes end walls 276, 278 at the front and the rear, respectively of the cover 212. In an exemplary embodiment, the sidewalls 272, 274 include locating features 280, such as ribs for locating the cover 212 relative to the housing 200 (shown in FIG. 8). Optionally, the locating features 280 may be positioned for keyed mating with the housing 200. The cover 212 includes a latching feature 282 configured to be latchably coupled to the housing 200. In an exemplary embodiment, the end walls 278 include an opening 284 configured to receive the power cables 150 (shown in FIG. 9). The end wall 278 may engage the power cables 150 to provide strain relief for the power cables 150. Optionally, the end wall 278 may include multiple openings receiving corresponding power cables 150 rather than a single opening.

In an exemplary embodiment, the cover 212 includes a securing feature 286 configured to secure the housing 200 to the movable unit 105 (shown in FIG. 2). In the illustrated embodiment, the securing feature 286 is a magnet 288; however, other types of securing features may be used in alternative embodiments. For example, the securing features may be a latch, a detent ball, or another type of securing feature. The securing feature 286 allows the housing 200 to be releasably coupled to the movable unit 105. Other types of securing features may be used in alternative embodiments to non-releasably fix the housing 200 to the movable unit 105, such as a threaded fastener, a clip, a weld pad, and the like.

Figure 11:
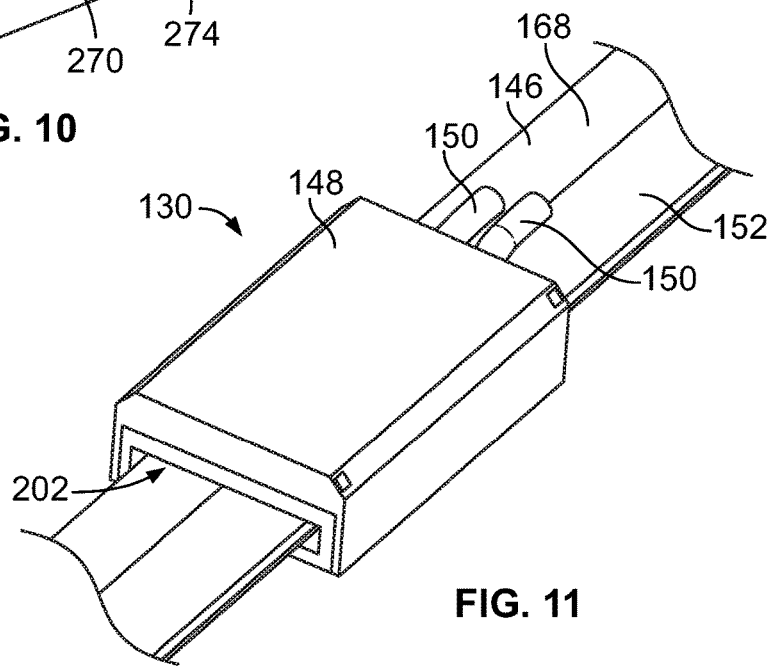
FIG. 11 is a top perspective view of a portion of the power connector assembly illustrating the power connector slidably coupled to a power rail in accordance with an embodiment.
Figure 12:
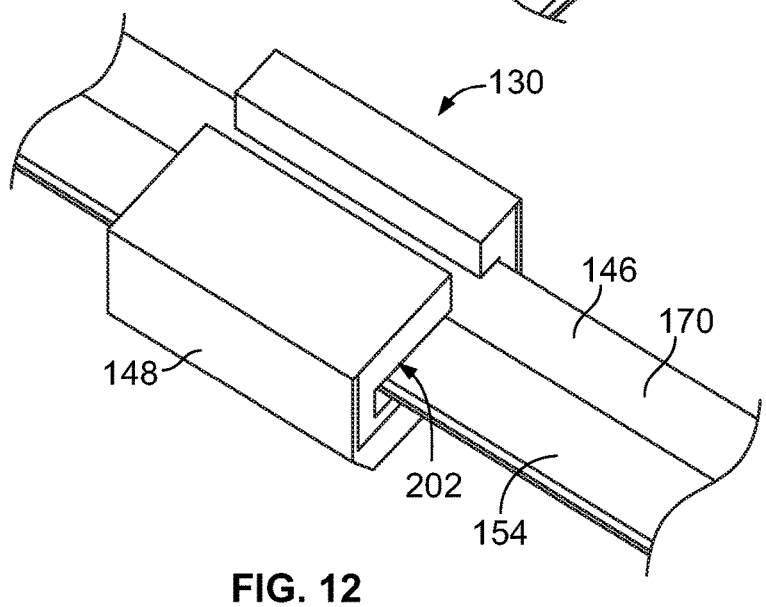
FIG. 12 is a bottom perspective view of a portion of the power connector assembly illustrating the power connector slidably coupled to the power rail in accordance with an embodiment.

FIG. 11 is a top perspective view of a portion of the power connector assembly 130 illustrating the power connector 148 slidably coupled to the power rail 146. FIG. 12 is a bottom perspective view of a portion of the power connector assembly 130 illustrating the power connector 148 slidably coupled to the power rail 146. The power rail 146 is received in the slot 202. The power connector 148 is configured to be electrically connected to the first and second power rail contacts 152, 154 on the upper surface 168 and the lower surface 170, respectively.

Figure 13:
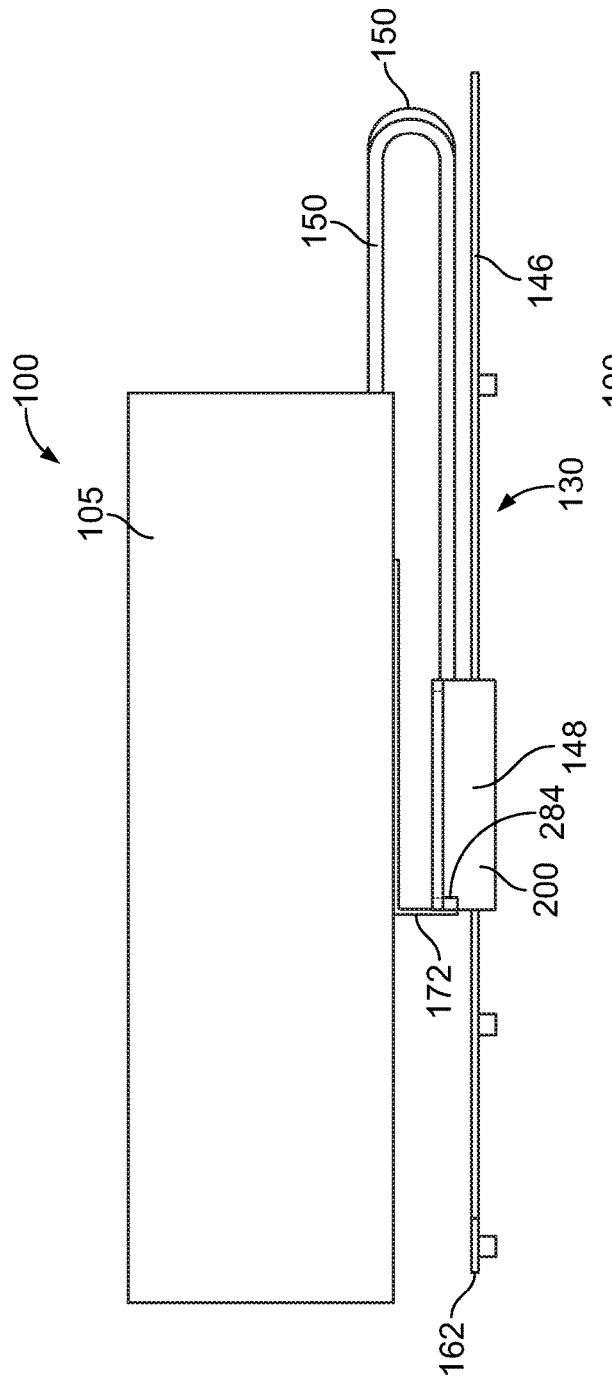
FIG. 13 is a side view of a portion of the communication system showing the power connector assembly coupled to the movable unit in accordance with an embodiment.
Figure 14:
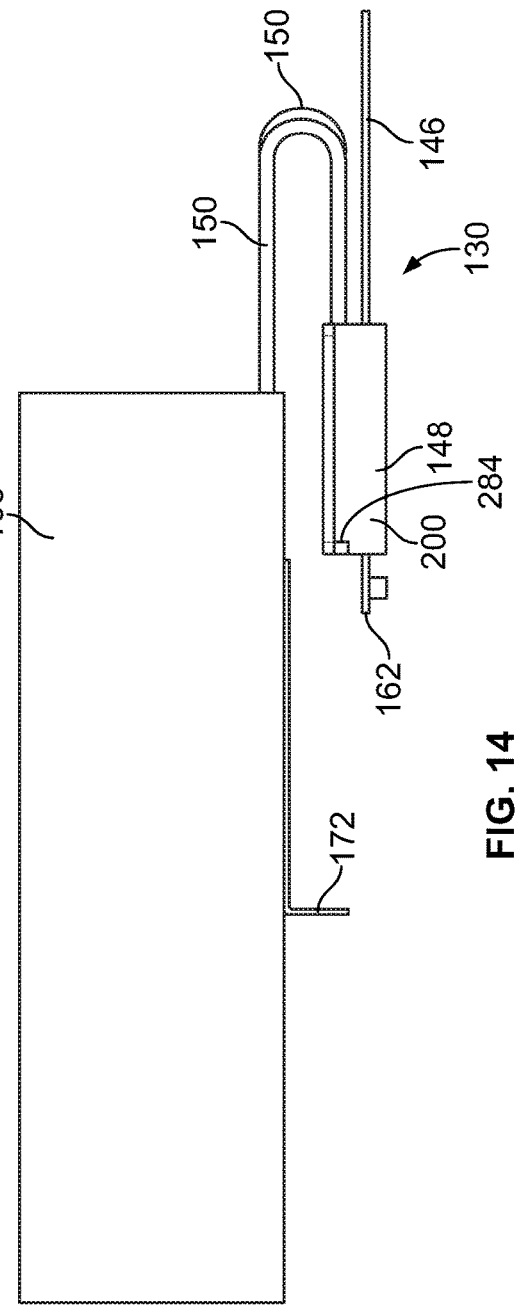
FIG. 14 is a side view of a portion of the communication system showing the power connector assembly coupled to the movable unit in accordance with an embodiment.

FIG. 13 is a side view of a portion of the communication system 100 showing the power connector assembly 130 coupled to the movable unit 105. FIG. 14 is a side view of a portion of the communication system 100 showing the power connector assembly 130 coupled to the movable unit 105. FIG. 13 illustrates the housing 200 of the power connector 148 coupled to the mounting bracket 172 of the movable unit 105. FIG. 14 illustrates the movable unit 105 physically detached from the power connector 148.

In an exemplary embodiment, the housing 200 may be magnetically coupled to the mounting bracket 172 using the securing feature 286. The power connector 148 slides forward and rearward along the power rail 146 with the movable unit 105. When the housing 200 bottoms out at the end 162 of the power rail 146, the housing 200 is unable to slide further forward. The housing 200 is releasable from the mounting bracket 172 allowing the movable unit 105 to extend further forward in the opening direction. The power cables 150 have sufficient slack to allow further extension of the movable unit 105 in the opening direction. The power cables 150 remain electrically connected to the movable unit 105 as the movable unit 105 is released from the power connector 148 and further opened. When the movable unit 105 is moved in the closing direction, the mounting bracket 172 is configured to reengage with the housing 200 and slide the power connector 148 and the closing direction.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35

U.S.C. § 112(f), unless and until such claim limitations expressly use the phrase "means for" followed by a statement of function void of further structure.

What is claimed is:

1. A power connector comprising:
a housing extending along a housing axis between a front and a rear opposite the front, the housing having a top and a bottom opposite the top extending between the front and the rear, the housing having a first side and a second side opposite the first side extending between the front and the rear, the housing having a first rail at the first side and a second rail at the second side, the first and second rails defining a slot configured to receive a power rail along the housing axis, the slot is open at the front and the rear, the housing having an upper wall above the slot and a lower wall below the slot, the housing having an upper contact channel in the upper wall, the housing having a lower contact channel in the lower wall;
a first power contact held by the housing above the slot, the first power contact having a first base received in the upper contact channel, the first power contact having deflectable first spring beams extending from the first base into the slot and being exposed at the slot for slidable electrical connection to a first power rail contact of the power rail on an upper surface the power rail; and
a second power contact held by the housing below the slot, the second power contact having a second base received in the lower contact channel, the second power contact having deflectable second spring beams extending from the second base into the slot and being exposed at the slot for slidable electrical connection to a second power rail contact of the power rail on a lower surface the power rail.

2. The power connector of claim 1, wherein the first spring beams extend toward the second spring beams and the second spring beams extend toward the first spring beams.

3. The power connector of claim 1, wherein the first spring beams extend to first mating interfaces and the second spring beams extend to second mating interfaces, the first mating interfaces being located below the first base in the slot, the second mating interfaces located above the second base in the slot.

4. The power connector of claim 1, wherein the first and second power contacts are aligned with each other on opposite sides of the slot.

5. The power connector of claim 1, wherein the first rail includes the upper contact channels and the lower contact channels.

6. The power connector of claim 1, wherein the lower wall includes a gap between the first rail and the second rail, the first and second power contacts being offset from the gap.

7. The power connector of claim 1, wherein the first spring beams extend forward from the first base and rearward from the first base, the second spring beams extending forward from the second base and rearward from the second base.

8. The power connector of claim 1, wherein the housing includes a securing feature configured to secure the housing to a movable unit, the housing configured to slide along the power rail with the movable unit.

9. The power connector of claim 8, wherein the securing feature is releasable from the movable unit to allow the movable unit to move relative to the housing.

10. The power connector of claim 1, further comprising a first power cable electrically coupled to the first power contact and extending from the housing to a movable unit and a second power cable electrically coupled to the second power contact and extending from the housing to the movable unit.

11. The power connector of claim 10, wherein the first power cable extends from the upper wall at the rear and the second power cable extends from the upper wall at the rear.

12. The power connector of claim 1, wherein the housing includes a cover at the top, the cover covering the first power contact.

13. The power connector of claim 1, wherein the second power contact includes a support bracket extending from the second base, the support bracket being coupled to the first side of the housing, the support bracket supporting the second base along the bottom.

14. A power connector assembly comprising:
a power connector having a housing holding a first power contact and a second power contact, the housing being configured to be coupled to and movable with a movable unit, the housing extending along a housing axis between a front and a rear opposite the front, the housing having a top and a bottom opposite the top extending between the front and the rear, the housing having a first side and a second side opposite the first side extending between the front and the rear, the housing having a first rail at the first side and a second rail at the second side, the first and second rails defining a slot configured to receive a power rail along the housing axis, the housing configured to slide along the power rail with the movable unit, the slot is open at the front and the rear, the housing having an upper wall above the slot and a lower wall below the slot, the housing having an upper contact channel in the upper wall, the housing having a lower contact channel in the lower wall, the first power contact having a first base received in the upper contact channel and deflectable first spring beams extending from the first base into the slot and being exposed at the slot for slidable electrical connection to a first power rail contact of the power rail on an upper surface the power rail, the second power contact having a second base received in the lower contact channel and deflectable second spring beams extending from the second base into the slot and being exposed at the slot for slidable electrical connection to a second power rail contact of the power rail on a lower surface the power rail;
a first power cable electrically coupled to the first power contact and extending from the housing to the movable unit; and
a second power cable electrically coupled to the second power contact and extending from the housing to the movable unit;
wherein the first and second power cables provide power to the movable unit from the first and second power contacts and the power rail.

15. The power connector assembly of claim 14, wherein the first spring beams extend toward the second spring beams and the second spring beams extend toward the first spring beams.

16. The power connector assembly of claim 14, wherein the first spring beams extend to first mating interfaces and the second spring beams extend to second mating interfaces, the first mating interfaces being located below the first base in the slot, the second mating interfaces located above the second base in the slot.

17. The power connector assembly of claim 14, wherein the first rail includes the upper contact channels and the lower contact channels.

18. The power connector assembly of claim 14, wherein the housing includes a securing feature configured to secure the housing to the movable unit, the housing configured to slide along the power rail with the movable unit, the securing feature being releasable from the movable unit to allow the movable unit to move relative to the housing.

19. A power connector assembly comprising:
a power rail that is elongated from a first end of the power rail to a second end of the power rail, the power rail having an upper surface and a lower surface, the power rail having a first power rail contact on the upper surface, the power rail having a second power rail contact on the lower surface; and
a power connector having a housing holding a first power contact and a second power contact, the housing being configured to be coupled to and movable with a movable unit, the housing extending along a housing axis between a front and a rear opposite the front, the housing having a top and a bottom opposite the top extending between the front and the rear, the housing having a first side and a second side opposite the first side extending between the front and the rear, the housing having a first rail at the first side and a second rail at the second side, the first and second rails defining a slot receiving the power rail along the housing axis, the housing slidable along the power rail with the movable unit, the slot is open at the front and the rear, the housing having an upper wall above the slot and a lower wall below the slot, the housing having an upper contact channel in the upper wall, the housing having a lower contact channel in the lower wall, the first power contact having a first base received in the upper contact channel and deflectable first spring beams extending from the first base into the slot and being exposed at the slot for slidable electrical connection to the first power rail contact of the power rail on the upper surface the power rail, the second power contact having a second base received in the lower contact channel and deflectable second spring beams extending from the second base into the slot and being exposed at the slot for slidable electrical connection to the second power rail contact of the power rail on the lower surface the power rail.

20. The power connector assembly of claim 19, wherein the first power rail contact and the second power rail contact are aligned with each other on the opposite upper surface and lower surface of the power rail.

* * * * *